United States Patent [19]

Higuchi et al.

[11] Patent Number: 5,560,804

[45] Date of Patent: Oct. 1, 1996

[54] ETCHING METHOD FOR SILICON CONTAINING LAYER

[75] Inventors: Fumihiko Higuchi, Yokohama; Yoshio Fukasawa, Kofu, both of Japan

[73] Assignees: Tokyo Electron Limited, Tokyo; Tokyo Electron Yamanashi Limited, Nirasaki, both of Japan

[21] Appl. No.: 380,325

[22] Filed: Jan. 30, 1995

Related U.S. Application Data

[63] Continuation of Ser. No. 15,057, Feb. 8, 1993, abandoned, which is a continuation-in-part of Ser. No. 849,589, Mar. 11, 1992, abandoned.

[30] Foreign Application Priority Data

Mar. 19, 1991 [JP] Japan .................................. 3-078317

[51] Int. Cl.$^6$ .................................................. H01L 21/00
[52] U.S. Cl. ........................... 156/643.1; 156/662.1; 437/233
[58] Field of Search ........................... 156/643.1, 646.1, 156/662.1, 651.1; 437/225, 233

[56] References Cited

U.S. PATENT DOCUMENTS

| | | | |
|---|---|---|---|
| 4,374,698 | 2/1983 | Sanders et al. | 156/643 |
| 4,431,477 | 2/1984 | Zajac . | |
| 4,468,285 | 8/1984 | Bayman et al. | 156/643 |
| 4,490,209 | 12/1984 | Hartman | 656/643 |
| 4,502,915 | 3/1985 | Carter et al. . | |
| 4,615,764 | 10/1986 | Bobbio et al. | 656/643 |
| 4,789,426 | 12/1988 | Pipkin | 656/643 |
| 4,818,334 | 4/1989 | Shwartzman et al. | 656/643 |
| 4,855,017 | 8/1989 | Douglas | 656/643 |
| 4,885,054 | 12/1989 | Shibaguki | 656/662 |
| 5,160,407 | 11/1992 | Latchford et al. | 156/643 |

FOREIGN PATENT DOCUMENTS

| | | |
|---|---|---|
| 0256311 | 2/1988 | European Pat. Off. . |
| 0272143 | 6/1988 | European Pat. Off. . |
| 0328350 | 8/1989 | European Pat. Off. . |
| 0350997 | 1/1990 | European Pat. Off. . |
| 0474244 | 3/1992 | European Pat. Off. . |
| 52-131466 | 11/1977 | Japan . |
| 53-124979 | 10/1978 | Japan . |
| 55-14143 | 4/1980 | Japan . |
| 02309633 | 12/1990 | Japan . |
| 03241829 | 10/1991 | Japan . |

OTHER PUBLICATIONS

"High Selectivity Electron Cyclotron Resonance Etching of Submicron Polysilicon Gate Structures", Ma et al., J. vol. Sci. Tech., A 10(4), Aug. 1992, 1217–1226.

"Highly Selective Reactive Ion Etching of Polysilicon with Hydrogen Bromide"; Tson; Journal of the Electrochemical Society (Oct. 1989); vol. 136, No. 10, abstract.

*Primary Examiner*—William Powell
*Assistant Examiner*—George Goudreau
*Attorney, Agent, or Firm*—Oblon, Spivak, McClelland, Maier & Neustadt, P.C.

[57] ABSTRACT

In plasma-etching a polysilicon layer of a semiconductor wafer where the polysilicon layer is formed on an $SiO_2$ film, plasma of a processing gas including a halogen element containing gas and a gas containing oxygen or nitrogen is generated, and a predetermined portion of the polysilicon layer is selectively exposed in plasma, thereby etching the portion.

19 Claims, 7 Drawing Sheets

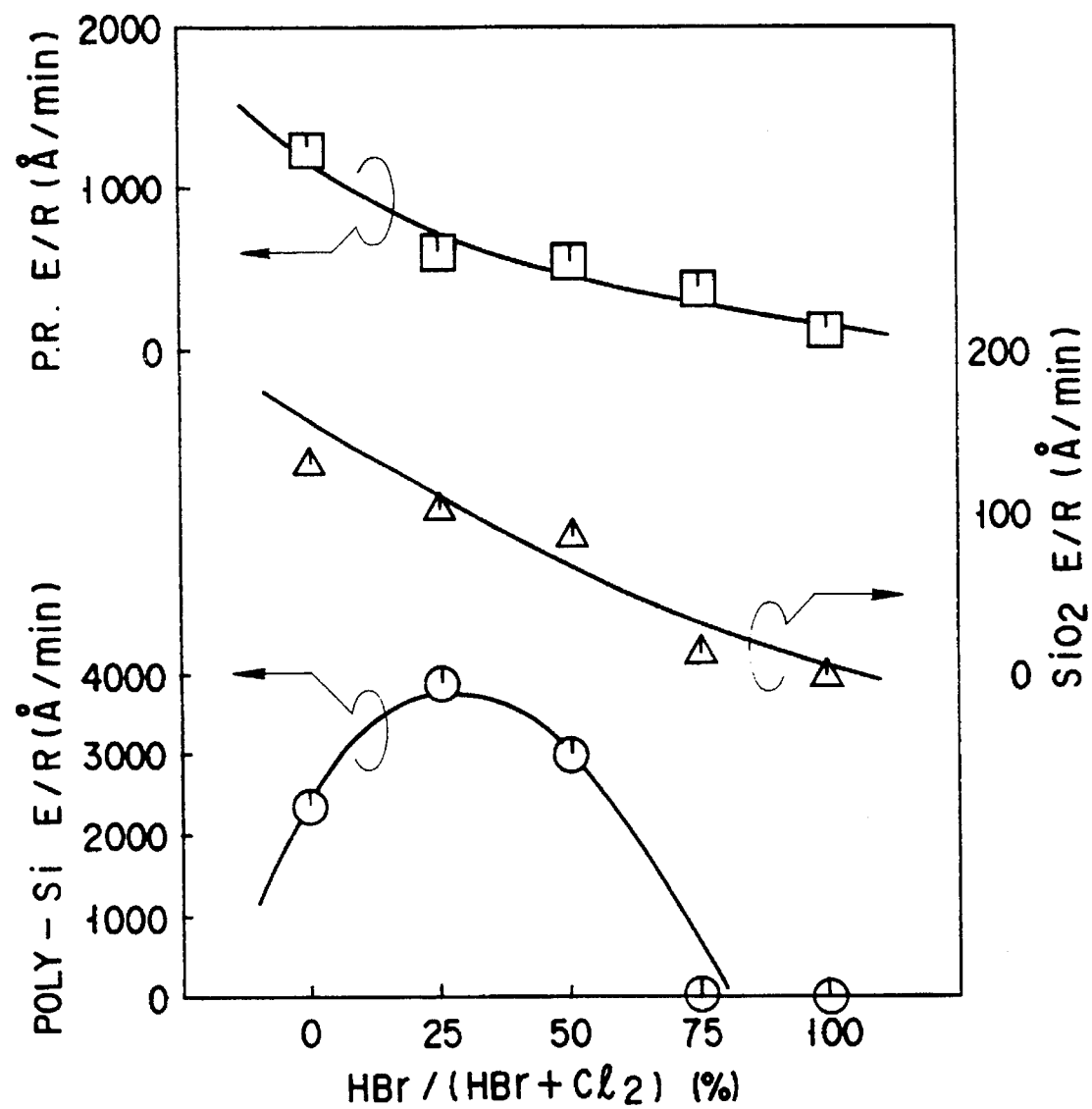
F I G. 9

ETCHING METHOD FOR SILICON CONTAINING LAYER

This application is a Continuation of application Ser. No. 08/015,057, filed on Feb. 8, 1993, now abandoned which is a Continuation-in-Part of Ser. No. 07/849,589, filed Mar. 11, 1992, now abandoned.

BACKGROUND OF THE INVENTION

1. Field of the Invention

The present invention relates to an etching method for a silicon containing layer of an object having a $SiO_2$ film a silicon containing layer adjacent thereto. This invention is applied, for example, to a case when a polysilicon layer, which is adjacent to the $SiO_2$ film in a semiconductor wafer, is etched.

2. Description of the Related Art

A dry etching of polysilicon has been used in for example a MOS transistor. As shown in FIG. 1, a MOS semiconductor wafer is formed of a silicon substrate 1, a $SiO_2$ gate insulating film 2 having a thickness of 100 to 300 Å formed on the silicon substrate 1, a polysilicon layer 3 having a thickness of about 3000 Å formed on the gate insulating film 2, and a resist film 4 formed on the polysilicon layer 3. In etching the polysilicon layer 3 in such a semiconductor wafer, a mixture of HBr gas and $Cl_2$ gas or HCl gas is used.

However, as shown in FIG. 2, in a portion where the polysilicon layer 3 is step-like formed, a portion 3a whose thickness is larger than the other portions is provided since a wire layer is further formed on a wire layer 7. As a result, in a case where the portion 3a and a portion 3b having a normal thickness are etched to be removed, the portion 3b is first removed by etching. As a result, as shown in FIG. 3, a residual portion 5 is generated at a portion corresponding to the portion 3a. Then, if the residual portion 5 is completely removed, the gate insulting film 2 is etched and a removal portion 6 shown in FIG. 6 may be formed. In other words, the part of the gate insulating film 2 is undesirably removed.

Since it is necessary to suppress damage of the Si substrate in etching polysilicon in the MOS semiconductor wafer, it is unfavorable that the above removed portion is formed. Therefor, it is required that the polysilicon layer be etched so as to have a high selection ratio to the $SiO_2$ gate insulating film, that is, (etching speed of polysilicon)/(etching speed of $SiO_2$). If the selection ratio is sufficiently high, the removal portion 6 can be considerably made small, and etching can be performed with a high accuracy of size.

However, in the conventional polysilicon etching, the selection ratio is about 30 and this is insufficient for the accuracy of size.

SUMMARY OF THE INVENTION

The present invention has been made in consideration of the above-mentioned problem, and an object of the invention is to provide a method for etching a silicon containing layer wherein the silicon containing layer can be etched at a high selection ratio to the $SiO_2$ layer in an object to be processed in which the silicon containing layer such as a polysilicon layer is formed on the $SiO_2$ layer.

According to the present invention there is provided a method for etching a silicon content layer in an object to be processed having a $SiO_2$ film and a silicon containing layer which is adjacent to the $SiO_2$ film and is formed of silicon-containing material other than $SiO_2$, comprising the steps of generating plasma of a processing gas containing mainly halogen element, and selectively exposing a predetermined portion of the silicon containing layer in plasma, thereby etching the portion, wherein the processing gas includes a gas containing oxygen or nitrogen.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a graph showing etching rate of polysilicon, $SiO_2$, and photoresist, where HBr and $Cl_2$ gas are used as the halogen element containing gas, as a function of the change in ratio of $HBr/(HBr+Cl_2)$;

DETAILED DESCRIPTION OF THE PREFERRED EMBODIMENTS

Figure 1:
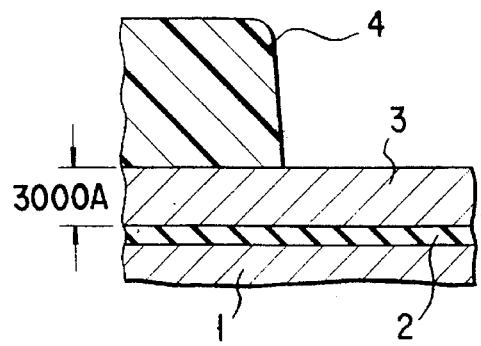
FIG. 1 is a cross sectional view showing a portion where a polysilicon layer in a semiconductor wafer is to be etched.
Figure 2:
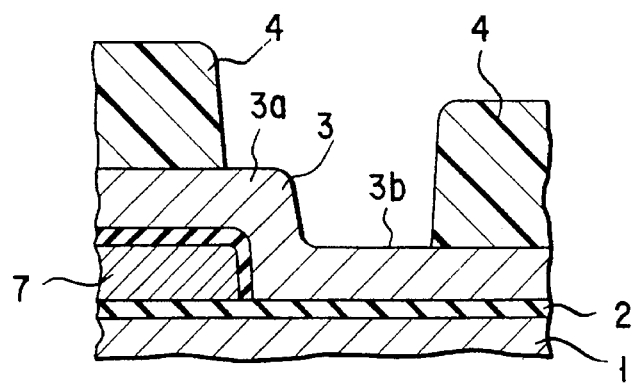
FIG. 2 is a cross sectional view showing the portion where the polysilicon layer in the semiconductor wafer is to be etched and the polysilicon layer is step-like formed.
Figure 3:
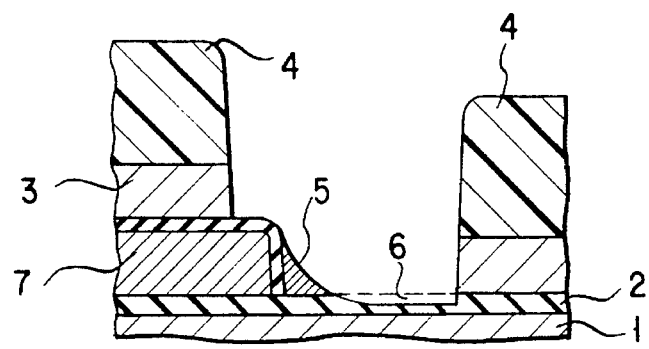
FIG. 3 is a cross sectional view showing a state that the polysilicon layer of FIG. 2 is etched.

The inventors of the present invention studied variously in view of a processing gas in connection with a method for etching a silicon containing layer at a high selection ratio to a SiO$_2$ layer. As a result, the inventors found out that the selection ratio was able to be considerably increased by adding a gas containing oxygen or nitrogen in processing gas. More particulary, in a case where SiO$_2$ is dissociated by ion impact due to plasma, oxygen in a processing gas is recombined with dissociated Si. On the other hand, a thin SiN film is formed on the surface of the SiO$_2$ layer by existence of nitrogen in a processing gas, thereby protecting the SiO$_2$ layer. Therefore, etching of the SiO$_2$ layer can be suppressed, and the silicon containing layer can be etched at a high selection ratio to the SiO$_2$ layer by adding gas containing oxygen or nitrogen to a processing gas. The present invention has been made based on the above-mentioned findings of the inventors of the present invention.

The present invention will be explained in detail.

The present invention is applied to an object to be processed having a SiO$_2$ film and a silicon containing layer which is adjacent to the SiO$_2$ film and is formed of silicon-containing material other than SiO$_2$. As an example of such an object to be processed, a semiconductor wafer in which a polysilicon film is formed on a SiO$_2$ film serving as an insulating film can be used. As other silicon containing materials, silicide, such as WSi and silicon nitride can be used.

In plasma-etching the silicon containing layer of such an object to be processed, there is used a gas containing oxygen or nitrogen together with halogen element containing gas as processing gas. The etching is performed by following procedures the object to be processed is provided in a processing chamber. The inside of the treating chamber is depressurized. A treating gas is supplied therein. Plasma of processing gas is formed in the chamber. A predetermined portion of the silicon containing layer of the object is selectively exposed in plasma.

Halogen element containing gas is not particularly limited as long as the halogen element is contained. However, one of Cl$_2$, HBr, HCl, HI, SF$_6$, and CF$_6$, or mixed gas of two or more gases is preferable. Moreover, in view of the control of the etching shape or the reduction of the etching product, two or more gases are preferably mixed.

Particularly, the mixed gas of Cl$_2$ gas and HBr gas is favorable and the flow rate of HBr is preferably within the range of 5–62% of the mixed gas of HBr gas and Cl$_2$, more preferably, it is within the range of 15–52%.

A gas containing oxygen or nitrogen is not limited as long as oxygen or nitrogen is contained. However, O$_2$, N$_2$O, CO$_2$, CO, N$_2$, and NO$_2$ is preferable.

the ratio of the flow rate of a gas containing oxygen or nitrogen to that of the processing gas is preferably 10% or less. If this type of gas is slightly contained, the above-mentioned effect can be expected. However, if the flow rate ratio exceeds 10%, the etching speed decreases. The favorable flow rate ratio ranges from 1 to 4.5%.

The pressure in the processing chamber while etching process is preferably 1 Torr or less.

In a case where the plasma-etching is performed as mentioned above, gas containing oxygen or hydrogen may be added in the treated gas from the beginning. However, during predetermined time in which there is not possibility of removal of SiO$_2$ layer, only halogen element containing gas is supplied and etching is performed. Oxygen or hydrogen is added to the processing gas after etching advances close to the SiO$_2$ layer.

The following explains an apparatus for executing the above-mentioned method.

Figure 4:
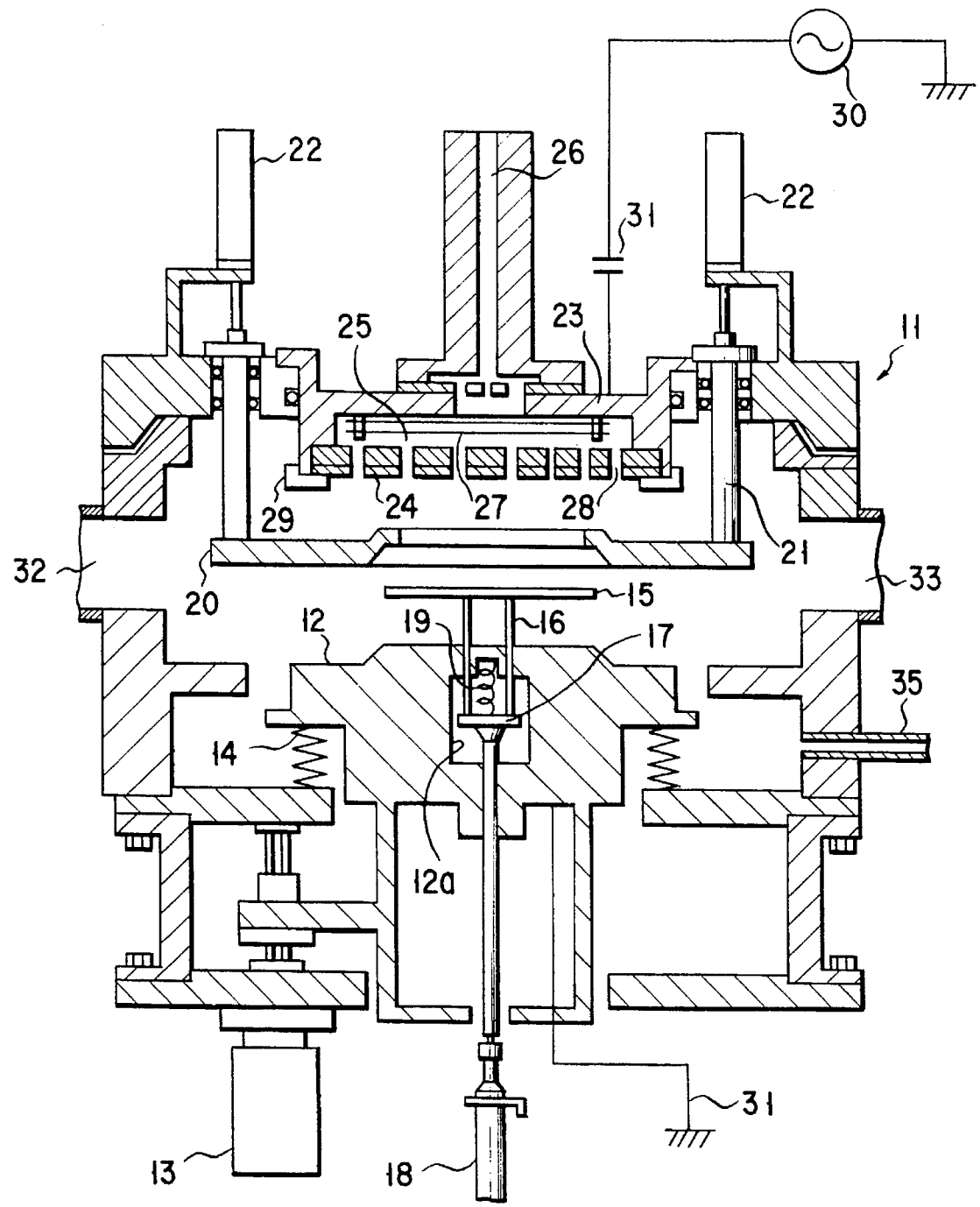
FIG. 4 is a cross sectional view showing one example of the apparatuses executing the present invention.

FIG. 4 is a view showing one example of a plasma etching apparatus to which the present invention is applied. This apparatus comprises a processing chamber 11 whose inside is maintained to be substantially airtight. The processing chamber 11 is formed of, for example aluminum the surface of which is anodized.

In the lower portion of the processing chamber 11, a lower electrode 12 is provided. The lower electrode 12 is formed of, for example, aluminum the surface of which is anodized.

In the lower electrode 12, there is formed a mounting section having a trapezoidal cross section in its central portion, and a object 15 to be processed, for example, a semiconductor wafer is mounted thereon. A surface portion of the electrode 12 except for the portion where the object is mounted are preferably coated with an insulating material, such as Teflon (trade name). Due to the coating, there can be improved a focus effect in which discharging concentrates on the object 15.

The lower electrode 12 can be lifted by a lifer 13 with a maximum stroke of, for example, 30 mm. The airtight in the chamber 11 during lifting the lower electrode 12 is ensured by a bellows 14 made of, for example, stainless steel.

In the lower electrode 12, a space 12a is formed in its central portion. A plurality of through holes (for example, four) which are through upward from the space 12a, and a lifter pin 16 made of, for example, stainless steel is inserted into each through hole. The lifer pin 16 is connected to a lift mechanism 18 via a plate 17. The lifter pin 16 is lifted by the drive of a lift mechanism 18. The lifter pin 16 moves up, so that the object 15 is separated from the lower electrode 12 to be in a transferable state. The lifter pin 16 moves down, so that the object 15 is mounted on the lower electrode 12. In order to buffer the movement of the lifter pin 16, the lower electrode 12 and the plate 17 are connected to each other by a coil spring 19.

A clamp ring 20 is provided above the lower electrode 12. The clamp ring 20 is used for uniformly pressing the object 15 to the surface of the lower electrode 12, and fixing the object 15 thereto. The central portion of the clamp ring 20 is shaped to correspond to the mounting portion of the lower electrode 12. The clamp ring 20 is formed of material having no influence on plasma, for example, aluminum the surface of which is anodized, quarts, and ceramic material such as alumina. The clamp ring 20 is held by a plurality of shafts 21 (for example four) which are airtightly through the upper portion of the chamber 11. Each shaft is connected to an independent driving mechanism such as an air cylinder 22, and each shaft moves up and down by the corresponding driving mechanism. The lower electrode 12 is moved up in a state that the object 15 is mounted on the lower electrode 12. Due to this, the object 15 is brought into contact with the clamp ring 20. Moreover, the lower electrode 12 is moved up, so that the clamp ring 20 clamps the object 15 by pressing force of the air cylinder 22. While necessary pressing force is maintained the clamp ring 20 can be further moved up to a predetermined height, for example, by 5 mm by adjusting the drive of the air cylinder 22.

A conductive material 23 is provided at the top portion of the chamber 11. The conductive material 23 is formed of, for example, aluminum the surface of which is anodized. An upper electrode 24, which is electrically connected to the conductive material 23, is provided away from the conductive material 23 with a narrow space 25. The upper electrode 24 is formed of, for example, amorphous carbon, aluminum, or aluminum the surface of which is anodized.

A gas supply pipe 26 communicates with a space 25. The gas supply pipe 26 introduces processing gas from a gas supply source (not shown), which is arranged in the outside of the chamber 11, together with carrier gas. As processing gas, there is used a gas containing oxygen or nitrogen is added to halogen element containing gas. Moreover, oxygen or nitrogen may be added to halogen element containing gas after etching advances up to the portion near the $SiO_2$ layer.

In the space 25, there are formed a plurality of baffles 27 having a plurality of openings in order to uniformly diffuse gas. A plurality of holes 28 is formed in the upper electrode 24 in order to supply gas diffused by baffles 27 into the chamber 11.

Note that, a shield ring 29, which is formed of insulating material such as Teflon, is provided in the peripheral portion of the upper electrode 24, and plasma can be generated to have the same diameter as the object 15.

A high frequency power supply 30 is connected to the upper electrode 24 via a capacitor 31 and the conductive material 23, and the lower electrode 12 is earthed. High frequency power is supplied to these electrodes from the power supply 30, so that plasma of processing gas generates between the electrodes. In this case, a plasma mode is a mode which a radical etching is performed.

The high voltage electrode is used as the lower electrode 12 and the upper electrode 24 is earthed, so that the mode can be in a reactant ion etching (RIE) mode. Moreover, RF electric power whose phase differs at 180 degrees can be supplied between the upper electrode 24 and the lower electrode 12. Furthermore, there may be used a magnetron etching type in which magnet is provided above or around the chamber 11, a crossed electromagnetic field is formed between the electrodes, and etching is performed. By use of magnet, etching treatment can be performed under a low pressure condition with high efficiency.

A gas exhaust port 35 is formed in the lower side portion of the chamber 11, and the chamber 11 is exhausted from the gas exhaust port 35 by a vacuum pump (not shown).

Figure 5:
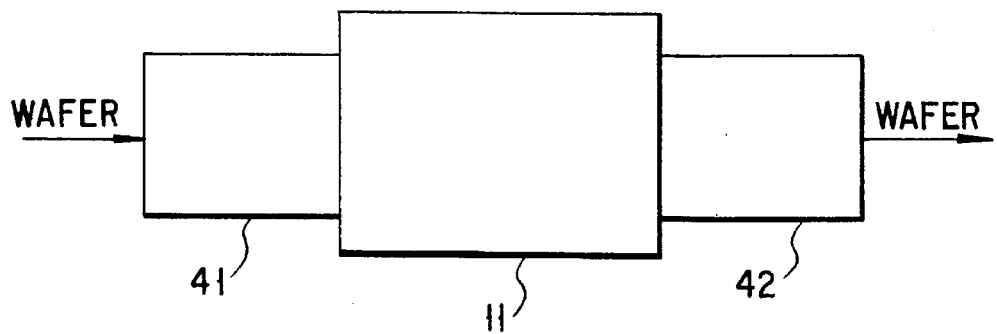
FIG. 5 is a schematic view showing a state that load lock chambers for carrying in and out are provided in the apparatus of FIG. 4.

In the two side surfaces of the chamber 11 opposing to each other, an inlet 32 for carrying in the object to be processed and an outlet 33 for carrying out the object are provided. Moreover, as schematically shown in FIG. 5, load lock chambers 41 and 42 for carrying in and out are formed to be continuous to the inlet 32 and the outlet 33. These load lock chambers 41 and 42 have inlet and outlet side gates, respectively, and are able to be exhausted. By the provision of these load lock chambers 41 and 42, the object 15 (for example a semiconductor wafer) can be carried in and out without having the inside of the chamber 11 come in contact with air.

In performing plasma etching by use of the above-mentioned apparatus, first of all, one object to be processed is taken up by a sender (not shown) and inserted into the load lock chamber 41 for carrying in. The inlet side gate of the load lock chamber 41 is closed, and the inside thereof is exhausted. Thereafter, the outlet side gate is opened, and the object 15 is carried in the portion above the lower electrode 12 by a carrying-in mechanism (not shown). The lifter pin 16 is moved up and the object 15 is received at the top end of the lifter pin 16, and the carrying-in mechanism is retracted. Thereafter, the inside of the chamber 11 is made airtight. The lifter pin 16 is moved down, so that the object 15 is mounted on the lower electrode 12. Then, the lower electrode 12 is moved up, and the surroundings of the object 15 is brought into contact with the clamp ring 20, and the object 15 is fixed to the clamp ring 20.

The inside of the chamber 11 is exhausted, processing gas is introduced therein via the gas supply pipe 26 from the gas supply source, and the inside of the chamber is made to have a predetermined pressure, for example, 1 Torr or less.

Thereafter, RF electric power is supplied between the upper electrode 24 and the lower electrode 12, and plasma of processing gas is generated therebetween. By means of the plasma, the silicon containing layer of the object 15 is etched.

After etching, as the inside of the chamber 11 is exhausted, the lower electrode 12 is moved down and the lifter pin 16 is moved up, and the object 15 is mounted thereon. Then, the object 15 is carried out via the load lock chamber 42 for carrying out by an carrying-out mechanism (not shown).

Examples of the present invention will be explained as follows.

EXAMPLE 1

Example 1 explains the case in which a semiconductor wafer is used as a object to be processed, and a polysilicon layer thereof is etched.

In this Example, the above-mentioned etching apparatus was used, and HCl of 200 SCCM and HBr of 30 SCCM, both serving as processing gas, were introduced to the chamber. The pressure of the inside of the chamber was set to be 50 m Torr, and high frequency electric power of 225 W was supplied between the electrodes from high frequency power supply of 13.56 MHz, and a polysilicon layer (having a thickness of 3000 Å) of the semiconductor wafer was etched. The distance between the electrodes was set to be 0.6 cm.

The etching treatment was made during the time in which the polysilicon layer was all etched in view of the calculation. Thereafter, oxygen or nitrogen containing gas such as $O_2$, $CO_2$, $N_2O$ were added to a processing gas at the various flow rates, respectively. An over-etching was performed for 60 min. under the same condition, and a residual portion of the polysilicon layer was removed. For comparison, there was an experiment in which oxygen or nitrogen containing gas is not added in over-etching, and the experimental result was shown in Table 1. The flow rate of oxygen or nitrogen containing gas was set to be 1, 3, 5, 10, and 15 SCCM

TABLE 1

| Flow | Gas | | |
|---|---|---|---|
| Rate | $O_2$ | $CO_2$ | $N_2O$ |
| 0 SCCM | 120 Å/min | 120 Å/min | 120 Å/min |
| 1 SCCM | 80 Å/min | 77 Å/min | 54 Å/min |
| 3 SCCM | 8 Å/min | — | — |
| 5 SCCM | 0 Å/min | 27 Å/min | 0 Å/min |
| 10 SCCM | 0 Å/min | 0 Å/min | 0 Å/min |
| 15 SCCM | 0 Å/min | 0 Å/min | 0 Å/min |

As shown in Table 1, the etching rate of the base $SiO_2$ layer was 120 Å/min in the case in which $O_2$, $CO_2$, and $N_2O$ gases were not added. In contrast, in the case in which $O_2$, $CO_2$, and $N_2O$ gases were added, the etching rate of the $SiO_2$ layer was reduced to 80 to 54 Å/min even if the flow rate was 1 SCCM. Particularly, the etching rate of the $SiO_2$ layer was considerably reduced when these rates were 3 SCCM or more, and the etching rate of the $SiO_2$ layer was 0 when the rate was 5 SCCM in the case of $O_2$, $N_2O$. When these flow rates were 10 SCCM or more in the case of all gases, The etching rate of the $SiO_2$ layer was 0.

In this case, the etching rate of the polysilicon layer was about 2500 Å/min.

As a result, the following fact was confirmed.

The selection ratio of silicon to the base $SiO_2$ layer increased by these additive gases. Particularly, by adding gases at the rate of 3 SCCM or more, the selection rate of about 50 was increased to 100 to infinity.

Moreover, there was a tendency that the etching shape was slightly deteriorated when the additive gas was 15 SCCM. In view of this point, it was confirmed that the flow rate of additive gas was favorably 3 to 10 SCCM. The flow rate corresponds to the flow rate ratio of 1.3 to 4.2% to the flow rate of the processing gas.

The above result shows the case in which $O_2$, $CO_2$, $N_2O$ were individually added. In the case in which these gases were mixed and the total amount was set as Table 1, substantially the same result as Table 1 was obtained.

Next, an experiment on influence of the flow rate ratio on the etching was conducted in the case in which HCl and HBr gas both serving as halogen element containing gases were used.

Figure 6:
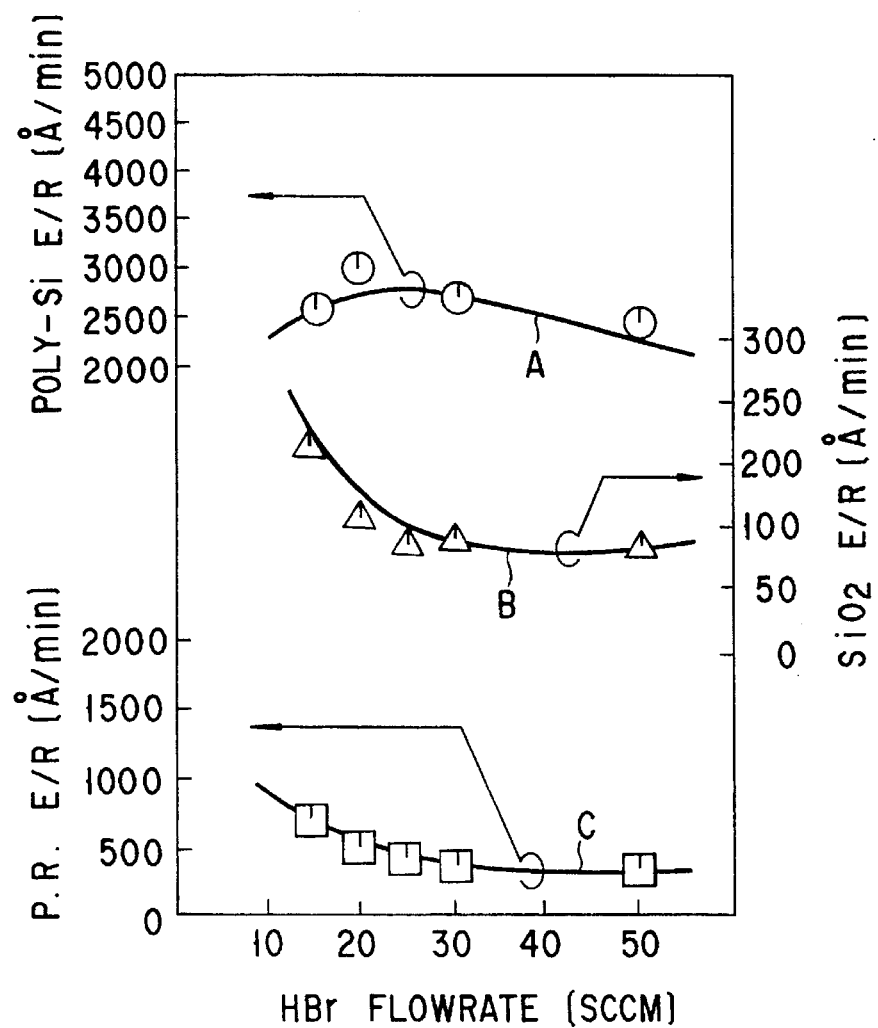
FIG. 6 is a graph showing an etching rate of each of the polysilicon layer, $SiO_2$ layer, and a resist layer, in a case where HCl and HBr gas are used as gas containing halogen element and HBr gas flow is changed.
Figure 7:
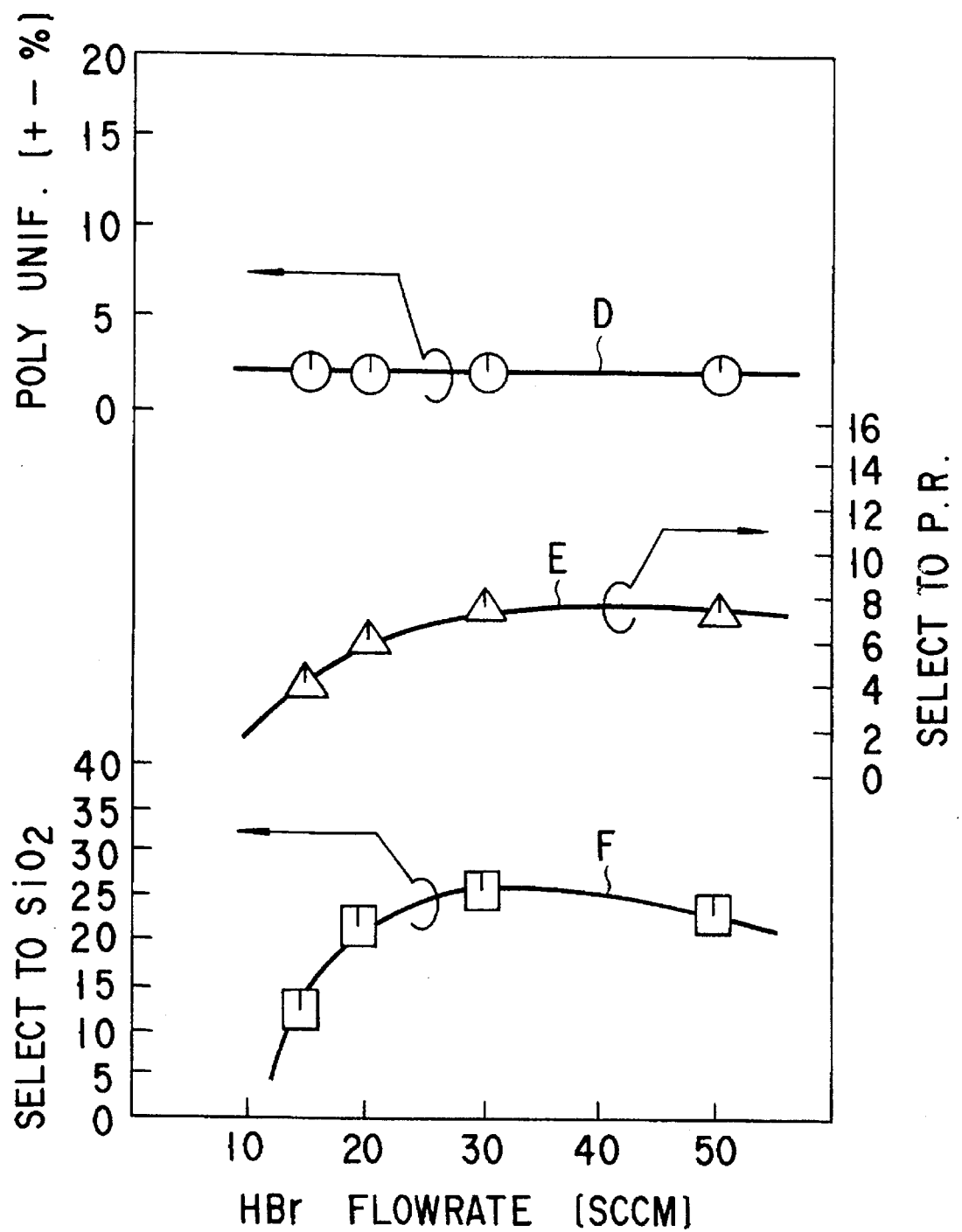
FIG. 7 is a graph showing a selection ratio of the polysilicon layer to the $SiO_2$ layer, a selection ratio of the polysilicon layer to the resist layer, and a uniformity of the polysilicon layer, in a case where HCl and HBr gas are used as gas containing halogen element and HBr gas flow is changed.

In this case, the flow rate of HCl gas was set to 200 SCCM, and the flow rate of HBr gas was changed in the rate of 15 to 50 SCCM. Then, the etching was performed in a state that the pressure of the inside of the chamber was set to 600 m Torr, high frequency electric power was 250 W, and the temperature was 20° C. The result was shown in FIGS. 6 and 7. In FIG. 6, a curve A is a resist etching rate, a curve B is an etching rate of the $SiO_2$ layer, and a curve C is an etching rate of the polysilicon layer. In FIG. 7, a curve D is a selection ratio of the polysilicon layer to the $SiO_2$ layer, a curve E is a selection ratio of the polysilicon to the resist layer, and a curve F is uniformity of the polysilicon layer.

As shown in these figures, it was confirmed that HCl gas of 200 SCCM and HBr gas of 20 to 40 SCCM were favorably added in order to obtain a favorable etching having a high etching rate of polysilicon and a high selection ratio of the polysilicon layer to $SiO_2$.

EXAMPLE 2

In this Example, $Cl_2$ gas was used in place of the mixing gas of HCl and HBr as a processing gas. Moreover, there was used an apparatus of RIE type in which the high frequency electric power supply was connected to the lower electrode, and an etching was performed in a state that a magnetic field was applied to the semiconductor wafer in a horizontal direction.

First of all, the flow rate of $Cl_2$ serving as a processing gas was set to 100 SCCM, and the flow rate of $O_2$ was changed in the range of 0 to 3 SCCM. These gases were introduced into the chamber, and the pressure of the chamber was set to 75 m Torr. Then, high frequency electric power of 150 W was supplied between the electrodes from the high frequency power supply of 13.56 MHZ, and the polysilicon (having a thickness of 3000 Å) of the semiconductor wafer was etched.

An applied magnetic field was set to about 100 gauss, and magnet for generating the magnetic field was rotated along the circumferential direction of the etching apparatus at 20 rpm.

Figure 8:
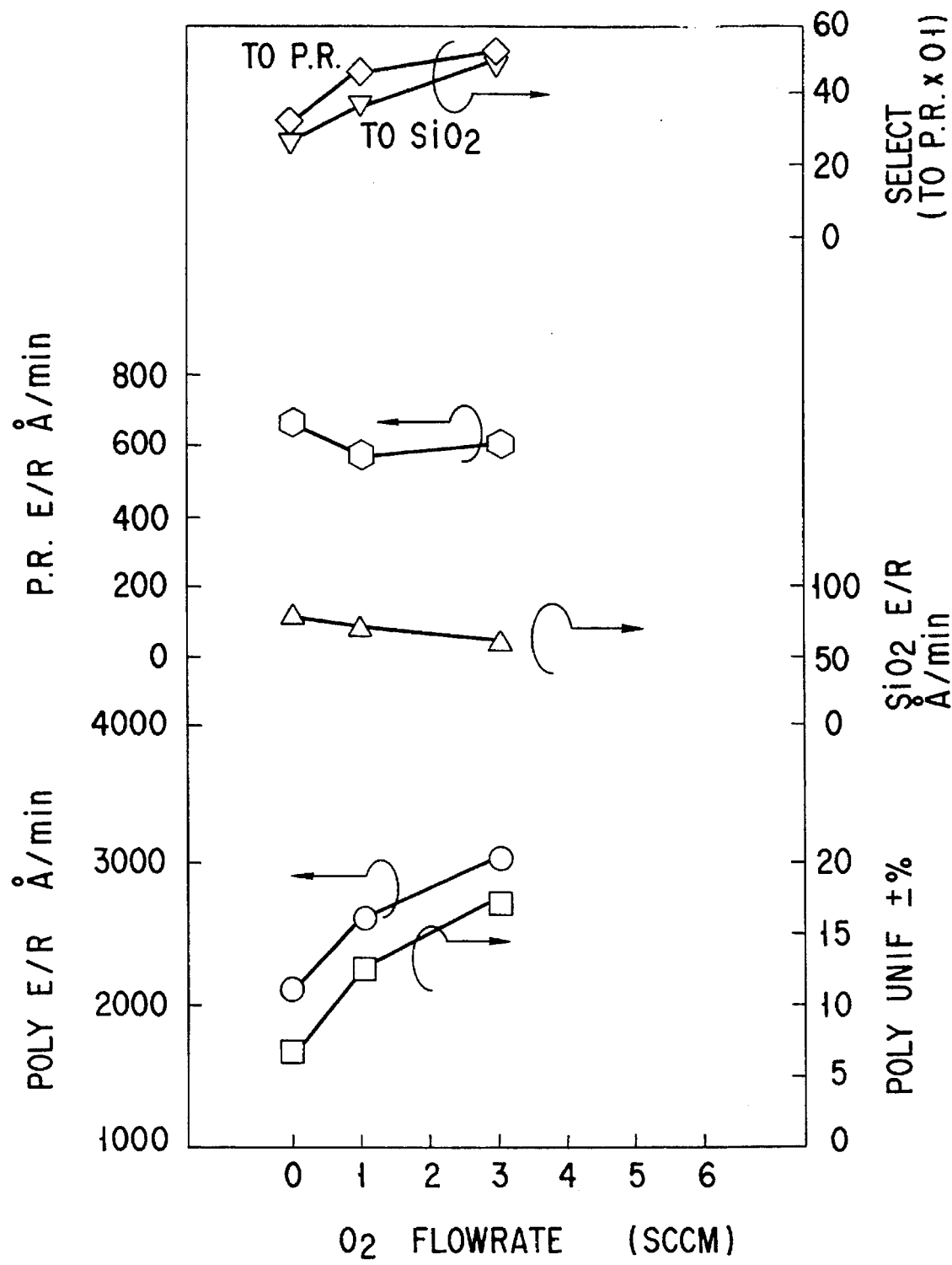
FIG. 8 is a graph showing a selection ratio of the polysilicon layer to the $SiO_2$ layer, the selection layer of the polysilicon layer to the resist layer, etching rates of the polysilicon layer, $SiO_2$ layer, and resist layer, and uniformity of the polysilicon layer, in a case where $Cl_2$ gas is used as halogen element content gas and $O_2$ gas is used as additive gas, and $O_2$ gas flow is changed.

The result was shown in Table 2 and FIG. 8. Table 2 shows an etching rate in each flow rate of $O_2$, and a selection rate of polysilicon to $SiO_2$, and the result is shown in FIG. 8. FIG. 8 also shows the etching rates of the polysilicon layer and the resist layer, a selection ratio to the resist layer, and uniformity of the resist layer.

TABLE 2

| Flow Rate of $O_2$ | $SiO_2$ Etching Rate | Selection Ratio (to $SiO_2$) |
| --- | --- | --- |
| 0 SCCM | 80 Å/min | 20 |
| 1 SCCM | 70 Å/min | 36 |
| 3 SCCM | 45 Å/min | 48 |

As shown in Table 2 and FIG. 8, it was confirmed that the selection ratio to the $SiO_2$ layer increased by addition of $O_2$ gas even in a case in which $Cl_2$ gas was used as processing gas.

The present invention relates to the etching method of the silicon content layer, and the etching method is not limited to the plasma etching using the opposing electrodes. It is needless to say that the other method in which, for example, an ECR is used, may be employed.

EXAMPLE 3

As in Example 1, the semiconductor wafer was employed as an object to be processed and a polysilicon layer thereof was etched.

First, the etching apparatus of the same type as used in Example 1 was employed, $O_2$ gas was added to the mixed gas of $Cl_2$ gas and HBr gas, and the resultant gas was introduced, as processing gas, into the chamber thereof. In this case, a flow ratio of the mixed gas of $Cl_2$ gas and HBr gas and $O_2$ gas was specified to 100 SCCM:1 SCCM; a flow rate ratio of HBr with respect to HBr+$Cl_2$ was changed at a ratio of 25% in the range within 0–100%; the internal pressure of the chamber was set to be 600 mTorr, a high frequency power supply set to be 250 W, the distance between the electrodes of a parallel plate set to be 8 mm; and an etching treatment was performed.

Figure 10:
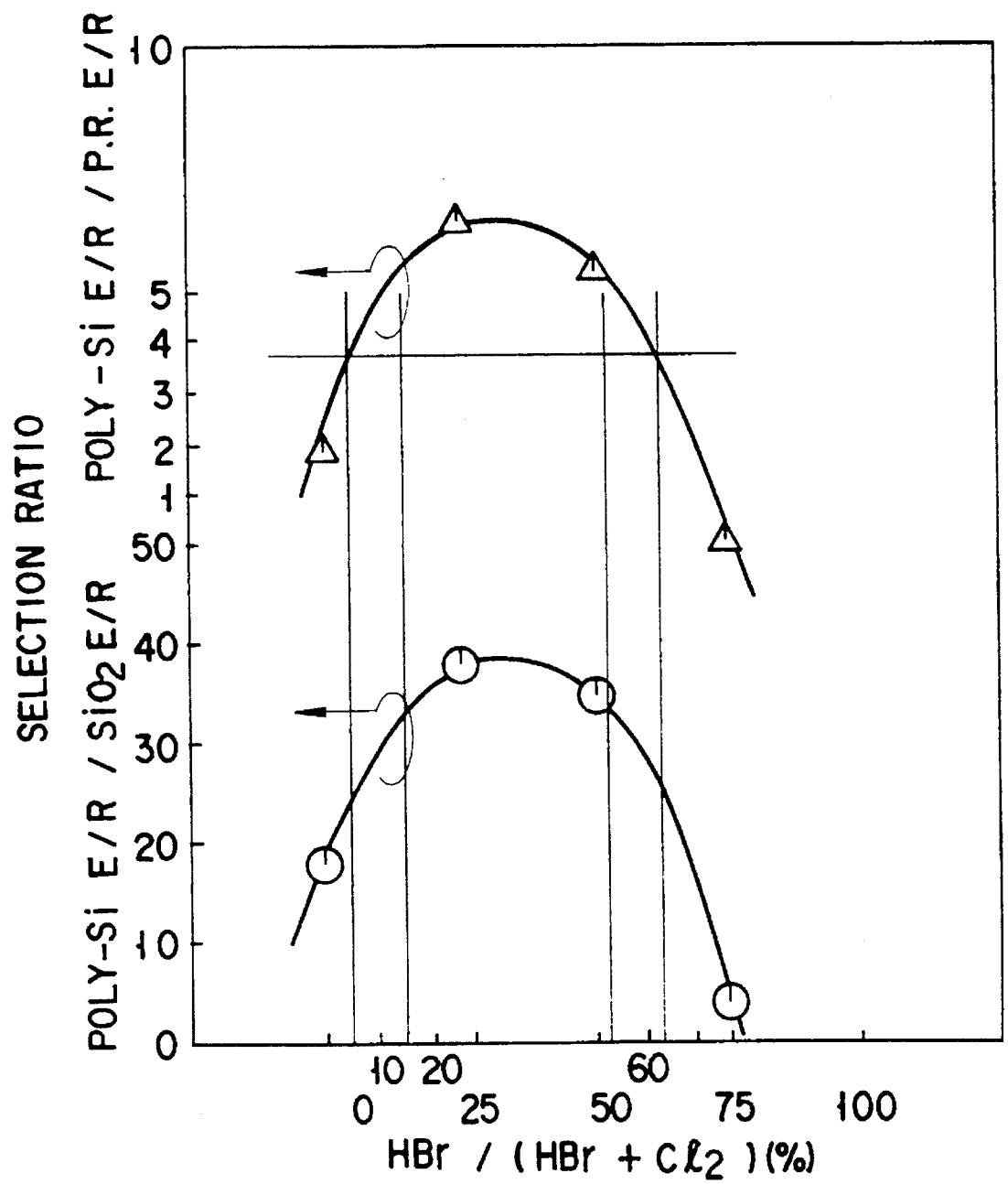
FIG. 10 is a graph showing selection ratio of the polysilicon with respect to $SiO_2$ and with respect to a photoresist, where HBr and $Cl_2$ gas are used as the halogen element containing gas, as a function of the change in ratio of $HBr/(HBr+Cl_2)$.

The result is shown in FIGS. 9 and 10. FIG. 9 shows an etching rate of polysilicon, $SiO_2$, and photo resist in each flow rate of HBr. FIG. 10 show a selection ration with respect to $SiO_2$ of the polysilicon and to photo resist in each flow rate of HBr.

As can be seen from FIGS. 9 and 10, the larger the amount of HBr, the less the etching rate of the photo resist and $SiO_2$. When HBr was approximately 25%, the etching rate of the polysilicon took a peak value. In addition, the selection ratio with respect to $SiO_2$ and photoresist is larger in the case where HBr was added to halogen gas than in the case where the halogen gas contained only $Cl_2$.

When HBr was in the range within 5–62%, a selection ratio with respect to $SiO_2$ of the polysilicon was equal to or more than 25, the selection ratio with respect to photo resist of this polysilicon was over 3.7. When HBr was in the range within 15–52%, a selection ratio with respect to $SiO_2$ of the polysilicon was equal to or more than 33, and a selection ratio with respect to photo resist of the polysilicon was 5 or more. In view of the foregoing, it was confirmed that HBr was preferably in the range of 5–62%, and more preferably within the range of 15–52%.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for etching a silicon containing layer in an object to be processed having a $SiO_2$ film and a silicon containing layer adjacent thereto and formed of silicon-containing material other than $SiO_2$, said method comprising the steps of:

generating plasma of a processing gas comprising $Cl_2$ gas and HBr gas wherein the ratio of HBr to HBr+$Cl_2$ is about 25% by volume;

exposing the silicon containing layer in plasma, thereby etching said layer, wherein said processing gas includes a gas containing oxygen.

2. The method according to claim 1, wherein said gas containing oxygen is at least one selected from a group consisting of $O_2$ gas, $N_2O$ gas, $CO_2$ gas, CO gas, and $NO_2$ gas.

3. The method according to claim 1, wherein the flow rate of said gas containing oxygen in said processing gas is 10% by volume or less.

4. The method according to claim 3, wherein the flow ratio of said gas containing oxygen in said processing gas is in the range of 1–4.5% by volume.

5. The method according to claim 1, wherein plasma of said processing gas is generated by supplying said processing gas to a chamber where said object to be processed is inserted, and by supplying high frequency electric power between a pair of electrodes opposing to each other.

6. The method according to claim 5, wherein pressure in the chamber is set to 1 Torr or less when plasma is generated.

7. The method according to claim 1, wherein said silicon containing layer is a polysilicon layer.

8. A method for etching a silicon containing layer in an object to be processed having a $SiO_2$ film and a silicon containing layer adjacent thereto and formed of silicon-containing material other than $SiO_2$, said method comprising the steps of:

generating plasma of a processing gas comprising $Cl_2$ gas and HBr gas;

exposing the silicon containing layer in plasma, thereby etching said layer, wherein said processing gas includes oxygen or nitrogen containing gas, which is at least one selected from the group consisting of $N_2O$ gas, $CO_2$ gas, CO gas, $N_2$ gas and $NO_2$ gas, and wherein the flow rate of said oxygen or nitrogen containing gas in said processing gas is 10% or less by volume.

9. The method according to claim 8, wherein the ratio of HBr to HBr+$Cl_2$ is in the range of 5–62% by volume.

10. The method according to claim 9, wherein the ratio of HBr to HBr+$Cl_2$ is in the range of 15–52% by volume.

11. The method according to claim 8, wherein plasma of said processing gas is generated by supplying said processing gas to a chamber where said object to be processed is inserted, and by supplying high frequency electric power between a pair of electrodes opposing to each other.

12. The method according to claim 11, wherein pressure in the chamber is set to 1 Torr or less when plasma is generated.

13. The method according to claim 8, wherein said silicon containing layer is a polysilicon layer.

14. A method for etching a silicon containing layer in an object to be processed having a $SiO_2$ film and a silicon containing layer adjacent thereto and formed of silicon-containing material other than $SiO_2$, said method comprising the steps of:

generating plasma of a processing gas comprising $Cl_2$ gas and HBr gas;

exposing the silicon containing layer in plasma, thereby etching said layer;

wherein said processing gas includes oxygen or nitrogen containing gas, which is at least one selected from the group consisting of $N_2O$ gas, $CO_2$ gas, CO gas, $N_2$ gas and $NO_2$ gas, and wherein the flow rate of said oxygen or nitrogen containing gas in said processing gas is in the range of 1–4.5% by volume.

15. The method according to claim 14, wherein the ratio of HBr to HBr+$Cl_2$ is in the range of 5–62% by volume.

16. The method according to claim 15, wherein the ratio of HBr to HBr+$Cl_2$ is in the range of 15–52% by volume.

17. The method according to claim 14, wherein plasma of said processing gas is generated by supplying said processing gas to a chamber where said object to be processed is inserted, and by supplying high frequency electric power between a pair of electrodes opposing to each other.

18. The method according to claim 17, wherein pressure in the chamber is set to 1 Torr or less when plasma is generated.

19. The method according to claim 14, wherein said silicon containing layer is a polysilicon layer.

* * * * *